United States Patent [19]
Lattimore et al.

[11] Patent Number: 5,831,896
[45] Date of Patent: Nov. 3, 1998

[54] MEMORY CELL

[75] Inventors: George McNeil Lattimore, Austin; Terry Lee Leasure, Georgetown; Gus Wai-Yan Yeung, Austin, all of Tex.

[73] Assignee: International Business Machines Corporation, Armonk, N.Y.

[21] Appl. No.: 767,772

[22] Filed: Dec. 17, 1996

[51] Int. Cl.$^6$ .................................................. G11C 11/00
[52] U.S. Cl. .......................................... 365/154; 365/156
[58] Field of Search .................................. 365/154, 156, 365/230.05

[56] References Cited

U.S. PATENT DOCUMENTS

| | | | |
|---|---|---|---|
| 4,189,785 | 2/1980 | Rapp | 365/156 |
| 4,441,169 | 4/1984 | Sasaki et al. | 365/154 |
| 4,536,859 | 8/1985 | Kamuro | 365/154 |
| 4,779,231 | 10/1988 | Holzapfel et al. | 365/156 |
| 4,833,648 | 5/1989 | Scharrer et al. | 365/154 |
| 4,872,141 | 10/1989 | Plus et al. | 365/154 |
| 5,214,327 | 5/1993 | Saeki et al. | 365/156 |
| 5,473,574 | 12/1995 | Clemen et al. | 365/230.05 |
| 5,481,495 | 1/1996 | Henkels et al. | 365/230.05 |
| 5,561,638 | 10/1996 | Gibson et al. | 365/230.05 |
| 5,621,693 | 4/1997 | Nakase | 365/156 |
| 5,642,325 | 6/1997 | Ang | 365/230.05 |
| 5,646,893 | 7/1997 | McMinn et al. | 365/230.05 |

*Primary Examiner*—David C. Nelms
*Assistant Examiner*—Trong Phan
*Attorney, Agent, or Firm*—Kelly K. Kordzik; Winstead Sechrest & Minick P.C.; Anthony V. S. England

[57] ABSTRACT

A five transistor memory cell, is a single ended static random access memory (SRAM) cell. Reading and writing from the cell is implemented with one bit line along with word line read and word line write signals. One of the transistors within the memory cell is not coupled directly to ground, but is instead coupled to a controlled impedance node. This permits the affected transistor to float between ground and a high impedance state, which permits one bit line to write into the memory cell.

32 Claims, 11 Drawing Sheets

MEMORY CELL

CROSS-REFERENCE TO RELATED APPLICATION

The present application is related to co-pending U.S. patent application Ser. No. 08/717,575, entitled "SINGLE END STATIC RAM CELL INCLUDING DYNAMIC VOLTAGE CONTROL DEVICE", which is hereby incorporated herein by reference.

1. TECHNICAL FIELD

The present invention relates in general to memory cells for use in storage systems and information handling systems, and more particularly, to a memory cell for static random access memories.

2. BACKGROUND INFORMATION

One of the goals in designing microelectronic circuitry is to reduce the amount of area required to implement a particular function, such as memory storage. Additionally, when a particular functionality requires less silicon to implement, there may also be a savings in power consumption and heat dissipation.

With today's software being developed, computer systems are in need of larger memory systems in order to adequately and efficiently run such software programs. As a result, memory systems often occupy a large amount of the integrated circuit ("chip") area.

Such memory systems often use static random access memories ("SRAM"). Dual rail SRAM cells are well-known in the prior art. FIG. 7 illustrates a prior art SRAM cell 700 having a standard design. Each SRAM cell 700 requires a bit line 713 and its complement 712. Cell 700 operates differentially between bit line 713 and complement 712. Precharge transistor 720 pre-charges bit line 713, and precharge transistor 708 pre-charges complement bit line 712. Control transistor 716 gates data from complement line 712 to the latch formed of cross-coupled inverters 724 and 726. Transistor 730 controls the connection between the latch formed of inverters 724 and 726 and bit line 713. Transistor 714 is a write enable control transistor. Transistor 710 is a write enable control for complement bit line 712. The outputs of cells 700 are connected to a sense amplifier (not shown) for transmission of the data at standard levels out of the storage array (not shown) for use by the information handling system.

The prior art SRAM cell 700 described above requires a certain amount of space on a chip and uses a predetermined amount of energy in its manufacture and in its operation. Therefore, what is needed in the art is an SRAM cell that is of a simpler design.

SUMMARY OF THE INVENTION

The foregoing need is addressed by the present invention, which provides an improved single-ended SRAM cell where one of the storage cell devices is connected to a controlled impedance node. The device implementing the controlled impedance node is shared among a whole set of memory cells.

In one form, the present invention comprises a memory cell including (1) a first transistor coupled between a first potential and a first node, wherein a gate electrode of the first transistor is coupled to a second node, (2) a second transistor coupled between a second potential and the first node, wherein a gate electrode of the second transistor is coupled to the second node, (3) a third transistor coupled between the first potential and the second node, wherein a gate electrode of the third transistor is coupled to the first node, (4) a fourth transistor coupled to the second node, and (5) a pass gate coupled between a bit line and the second node, wherein the fourth transistor is placed in a high impedance state during a write operation to the memory cell.

One advantage of the present invention is that it requires only 5 transistors to implement, as opposed to the typical 6 transistors needed to implement a double-ended SRAM cell. It is well-known in SRAM design that PFETs can be replaced with thin film transistors or poly load resistors. If poly load resistors are used to replace PFETs in the cell, then the cell can be implemented with only 3 transistors.

Another advantage of the present invention is that it potentially requires less silicon to implement.

Yet another advantage of the present invention is that it provides a more reliable method for writing the SRAM cell when compared to other single-ended SRAM cells.

Yet another advantage of the present invention is that its simplified design requires less energy in its manufacture and in its operation, and thus may dissipate less heat.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
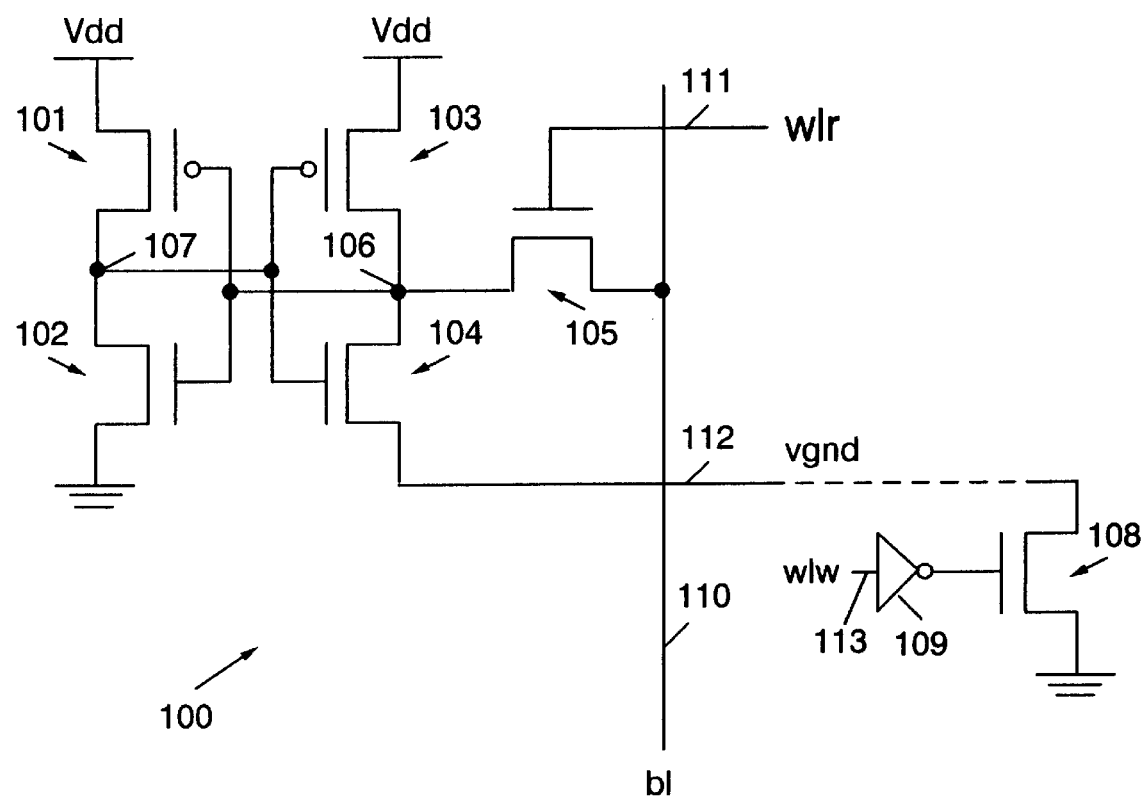
FIG. 1 illustrates an SRAM cell in accordance with the present invention.

In the following description, numerous specific details are set forth such as specific word or byte lengths, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Figure 7:
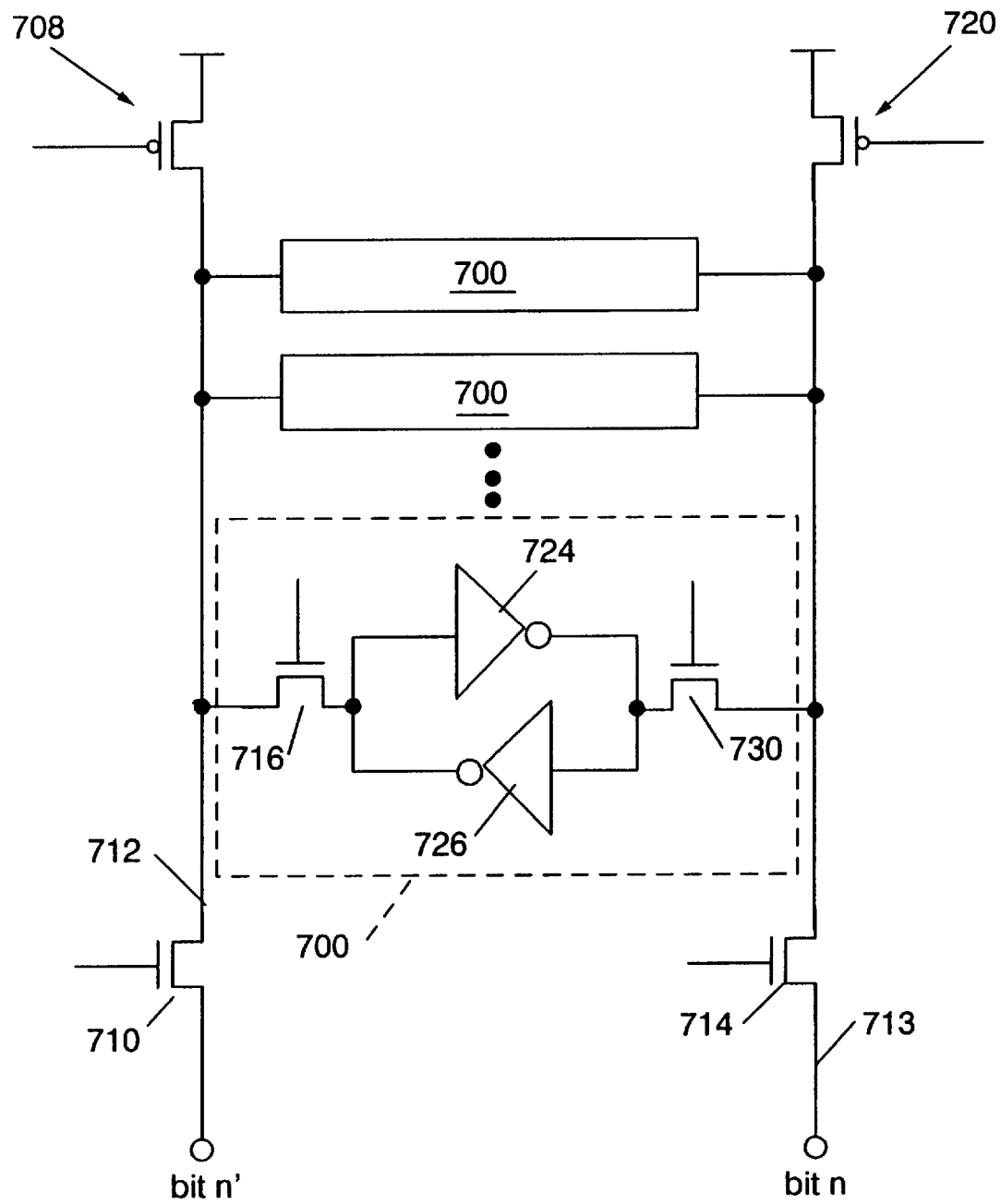
FIG. 7 illustrates a prior art memory cell.
Figure 8:
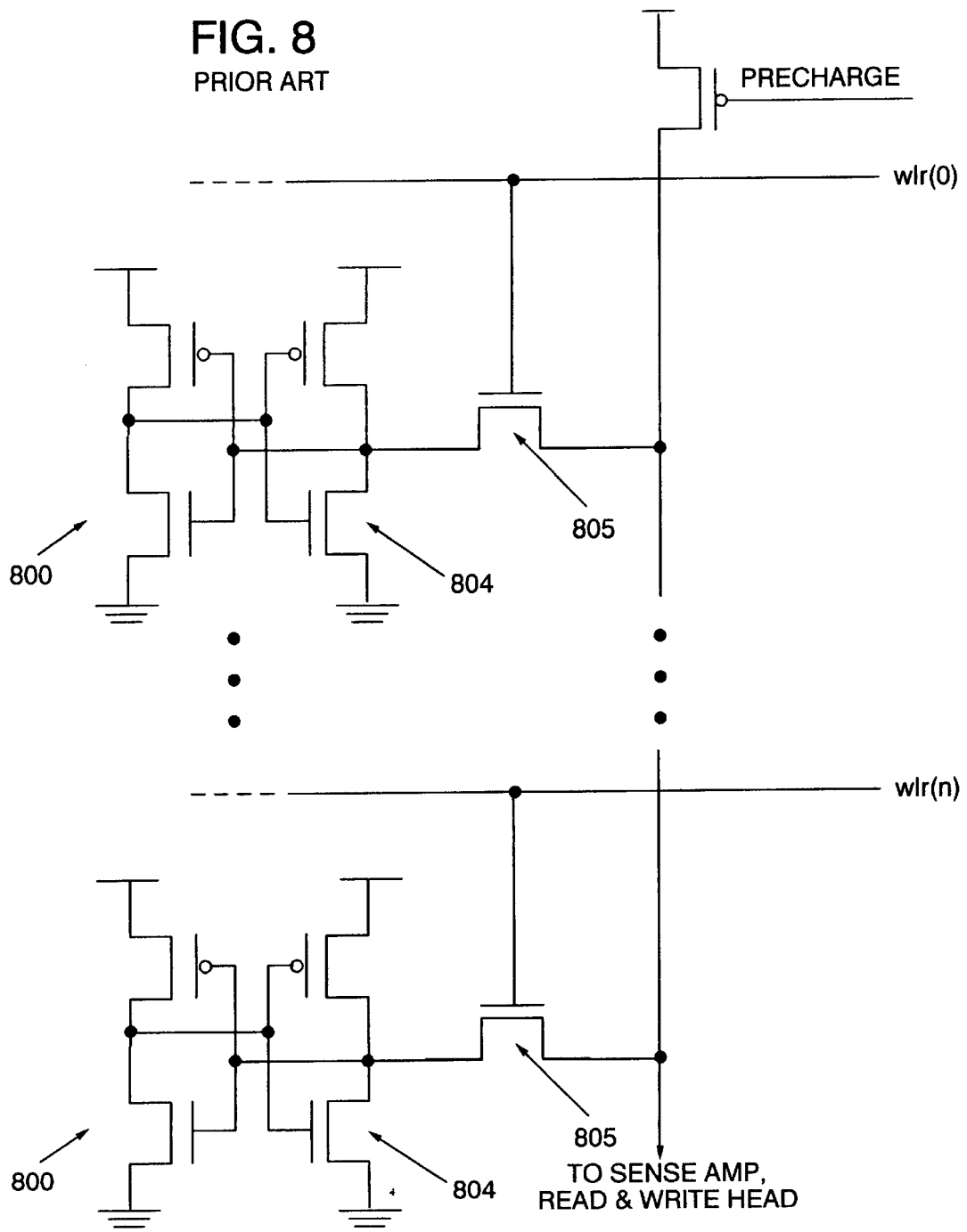
FIGS. 8 and 9 illustrate prior art single-ended SRAM memory cells.
Figure 9:
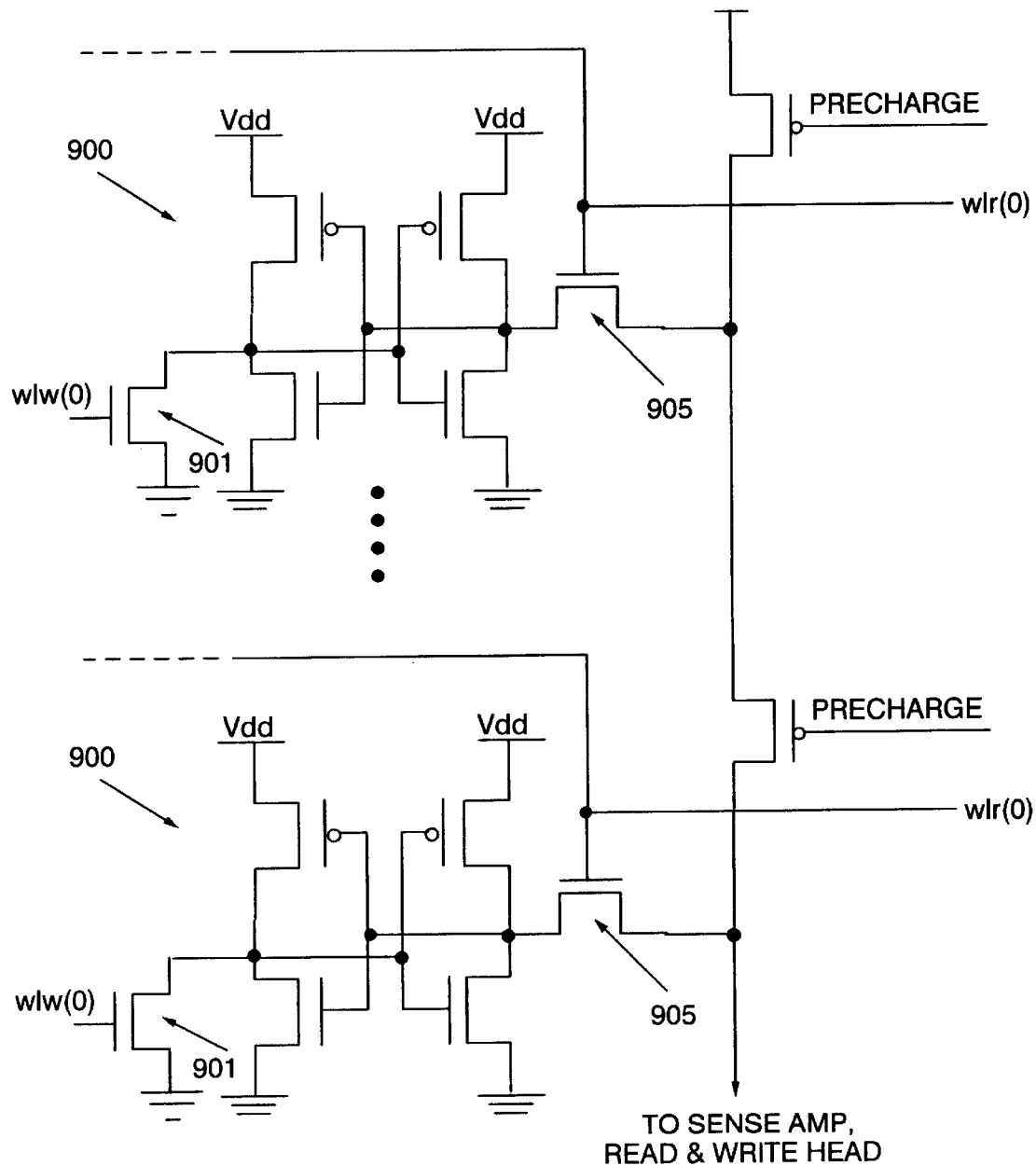

Referring to FIG. 1, there is illustrated SRAM cell 100 configured in accordance with the present invention. SRAM cell 100 comprises only 5 transistors 101–105. Memory cell 100 is to be compared to prior art memory cell 700 illustrated in FIG. 7, which requires 6 transistors to implement (4 transistors required to implement inverters 724 and 726 plus transistors 716 and 730). Additionally, compared to prior art single-ended SRAM cell 900 (see FIG. 9), SRAM cell 100 is 10–15% smaller in size with no performance loss. Furthermore, compared to prior art single-ended SRAM cell 800 (see FIG. 8), SRAM cell 100 operates faster. There is also potential savings with respect to the traditional dual-rail 6-device SRAM cell 700. Since a typical memory subsystem, such as a primary or secondary cache coupled to a processor (see FIG. 5), can occupy a significant portion of a chip, SRAM cell 100 may provide significant savings in silicon real estate.

Within the following discussion, transistors 101 and 103 are p-channel field effect transistors ("PFETs"), and transistors 102, 104, 105, and 108 are n-channel FETs ("NFETs").

In prior art SRAM cell 700, there are two bit lines 712 and 713 and two pass gates 716 and 730. True and complement data are written into SRAM cell 700 through pass gates 716 and 730. This is necessary because an NFET pass gate is a good conductor for a logic "0", but a poor conductor for a logic "1."

In SRAM cell 800 (see FIG. 8), there is only one pass gate NFET 805. During a write operation, pass gate 805 needs to transfer either a logic "1" or a logic "0" into cell 800. Writing a logic "0" into cell 800 is not a problem because NFET 805 can transfer a full logic "0." However, writing a logic "1" would require pass gate 805 to transfer a logic "1" and overwrite what is stored in NFET 804. For any memory cell, such as cell 800, NFET 804 is bigger than NFET 805 to provide enough stability during a read operation, otherwise cell 800 may be overwritten by bit line (b1) 810 during a read operation. Additionally, NFETs 804 and 805 are both small to minimize area. Therefore, it is not desirable to increase the size of NFET 805 such that a logic "1" can be safely written into memory cell 800. Cycle time is slowed to ensure the correctness of the write operation. In SRAM cell 900 (see FIG. 9), there is only one pass gate 905, but a reset transistor 901 has been added. Before a write operation, reset transistor 901 is turned on storing a logic "1." After cell 900 is reset, a logic "0" can be written into cell 900. The problem with this approach, however, is that it adds area and critical timing. To overcome this problem of writing a logic "1" into cell 100, the present invention provides a new approach of writing into cell 100.

In the present invention, NFET 104 is not coupled directly to ground, such as NFET 102. Instead, it is connected to a controlled impedance node (vgnd) 112. Vgnd 112 is controlled by NFET 108. NFET 108 is shared among the whole set of memory cells (in this example, 18 bits), therefore, it does not add significant area to the overall array (see FIG. 2). Since memory cell 100 drives a single bit line 110 (single ended read and write), it may be used advantageously in a ripple array configuration or other single ended applications (see FIG. 5; most sense amps require dual rail data).

Figure 2:
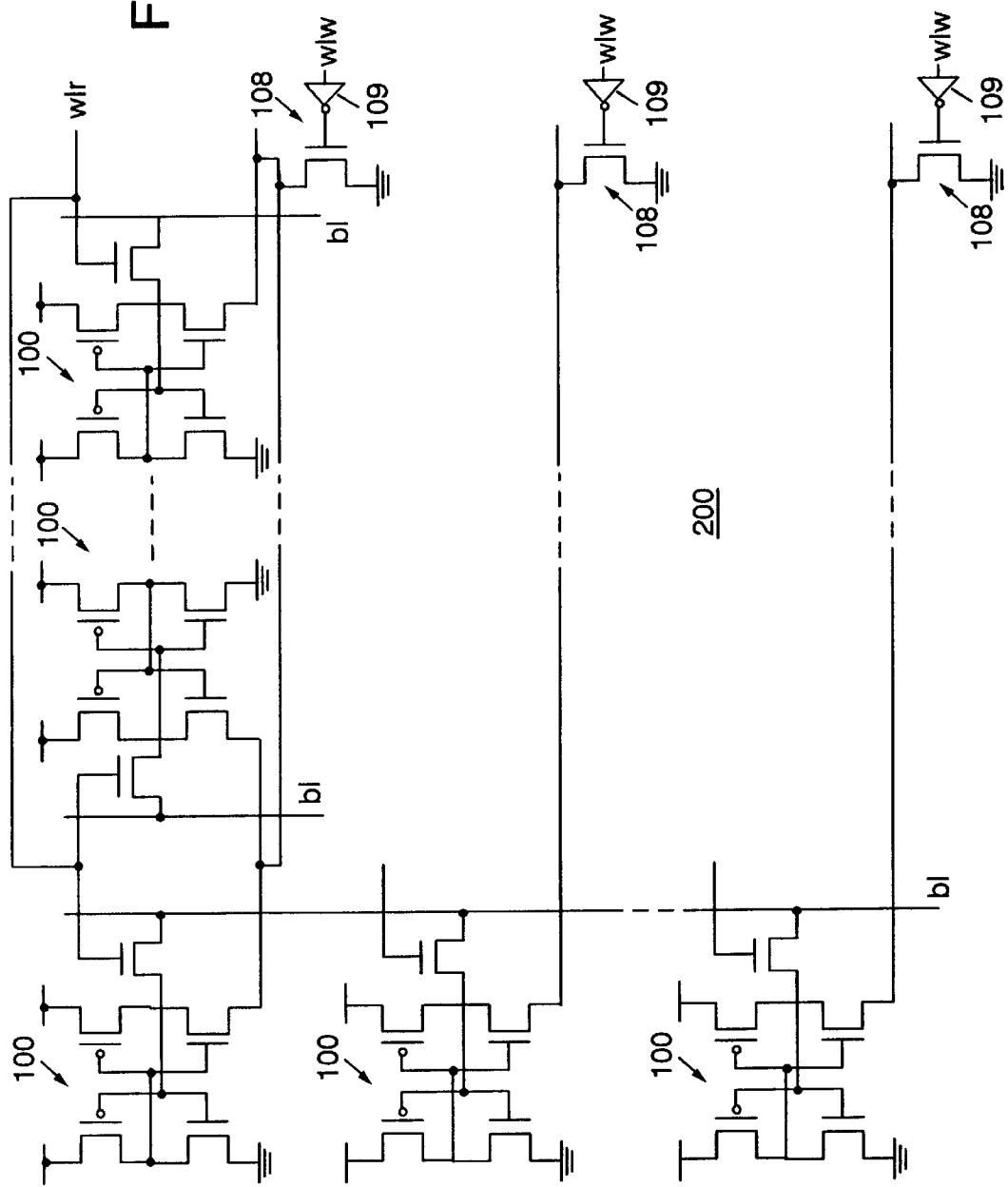
FIG. 2 illustrates an array using SRAM cells in accordance with the present invention.

Referring to FIG. 2, there is illustrated a memory array using a plurality of SRAM cells 100, where NFETs 108 are shared by memory cells 100 lying along a set of bits.

Referring back to FIG. 1, before a read/write operation, bit line 110 is pre-charged high. During a read operation, word line read (wlr) 111 is asserted, while word line write (wlw) 113 is maintained low, which is the state of wlw in all situations, except for a write operation, which is described below. Except during a write operation, NFET 108 is normally enabled. Suppose memory cell 100 is storing a logic "1." PFET 103 drives a logic "1" to bit line 110 through NFET 105. As a result, bit line 110 is not discharged. If memory cell 100 is storing a logic "0," NFET 104 discharges bit line 110 through NFET 104 to vgnd 112. Since NFET 108 is on, bit line 110 is discharged to a logic "0."

Figure 3:
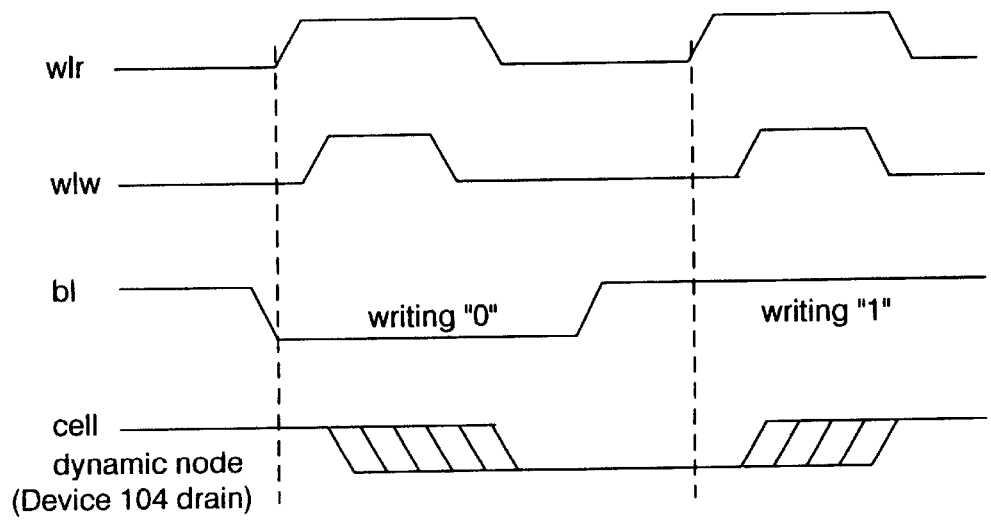
FIG. 3 illustrates a timing diagram for writing to the SRAM cell of the present invention.

For a write operation, there are two steps performed, which are further illustrated in FIG. 3. In the first step, word line write 113 and word line read 111 each switch to a logic "1." This turns NFET 108 off, therefore disabling NFET 104 (it cannot drive a logic "0"). To write a logic "0," bit line 110 is driven to a low. A logic "0" is passed through NFET 105 into memory cell 100. PFET 101 is turned on and NFET 104 is turned on. However, since NFET 104 is not connected to ground, the data just written into memory cell 100 is held in a metastable state. In step 2, word line write 113 is switched to a logic "0," but word line read 111 remains high. This turns NFET 108 on and therefore enables NFET 104. NFET 104 fully discharges node 106 and completes the cross-couple inverter circuit. The logic "0" is stored in cell 100.

Writing a logic "1" uses the same steps. Bit line 110 is driven to a logic "1." Word line write 113 and word line read 111 both switch to a logic "1." A pseudo logic "1" (VDD-Vt) is passed into memory cell 100 through NFET 105. Since NFET 104 is not grounded, it cannot discharge, and therefore does not "fight" against NFET 105. NFET 102 is turned on, and PFET 101 may be "slightly" switched on. Since in normal design NFET 102 will be much stronger than PFET 101, then node 107 will go low, turning PFET 103 on. As soon as PFET 103 is turned on, node 106 is pulled to a full VDD level and turns off PFET 101. Word line write 113 is then turned off, but word line read 111 stays high. NFET 108 is turned on, however, NFET 104 is turned off. As a result, a logic "1" is stored in cell 100.

It is easier to write into the circuit in accordance with the present invention, because node 112 between NFETs 104 and 108 is allowed to float. The controlled impedance node 112 is allowed to float from ground to a high impedance, since NFET 108 is turned off by wlw 113. During this state, current is not allowed to flow through NFET 104.

It is desirable to maintain a certain ratio between the sizes (width between source and drain) of NFETs 104 and 105 for memory cell 100 to remain stable during a read operation. Since an extra device is added to the N-tree, it is necessary to increase the ratio. To have enough margin, the ratio may be increased to 3×. This will improve stability margin. However, this will increase area. To minimize area, NFET 105 may be kept at a minimum size. To maintain (or boost) performance, NFET 108 is made as large as the area allows. This "tapering" of the N-tree will minimize area while boosting performance for memory cell 100. In addition, NFET 108 must be large enough to reduce "ground bounce" on vgnd 112.

Figure 4:
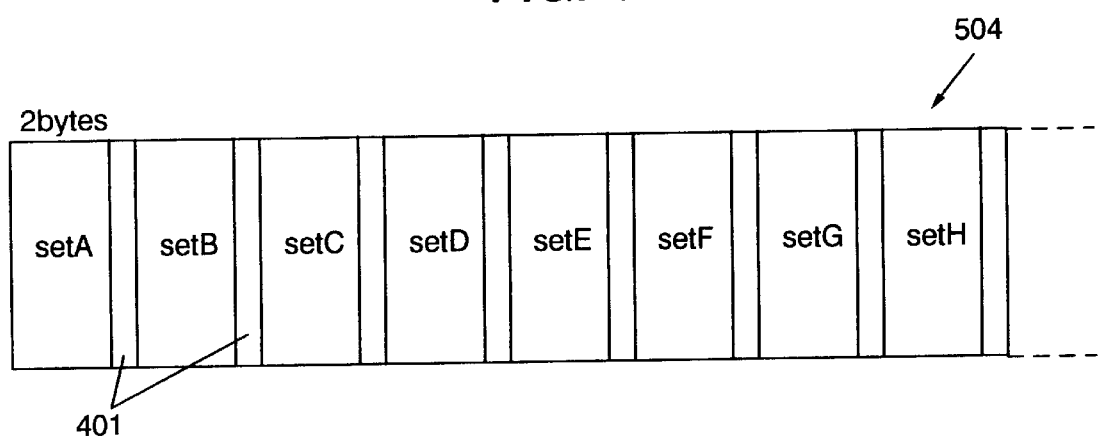
FIG. 4 illustrates an array configuration in accordance with the present invention.

As noted within FIG. 2, and as further illustrated in FIG. 4, in order to minimize area, NFET 108 is shared across one set of bits. NFET 108 is built in the gap cell 401 between sets, which is needed for power bus connection. Array 504 implements such a configuration. Each gap cell 401 is for ground, VDD, N-well tied, and NFET 108.

Figure 10:
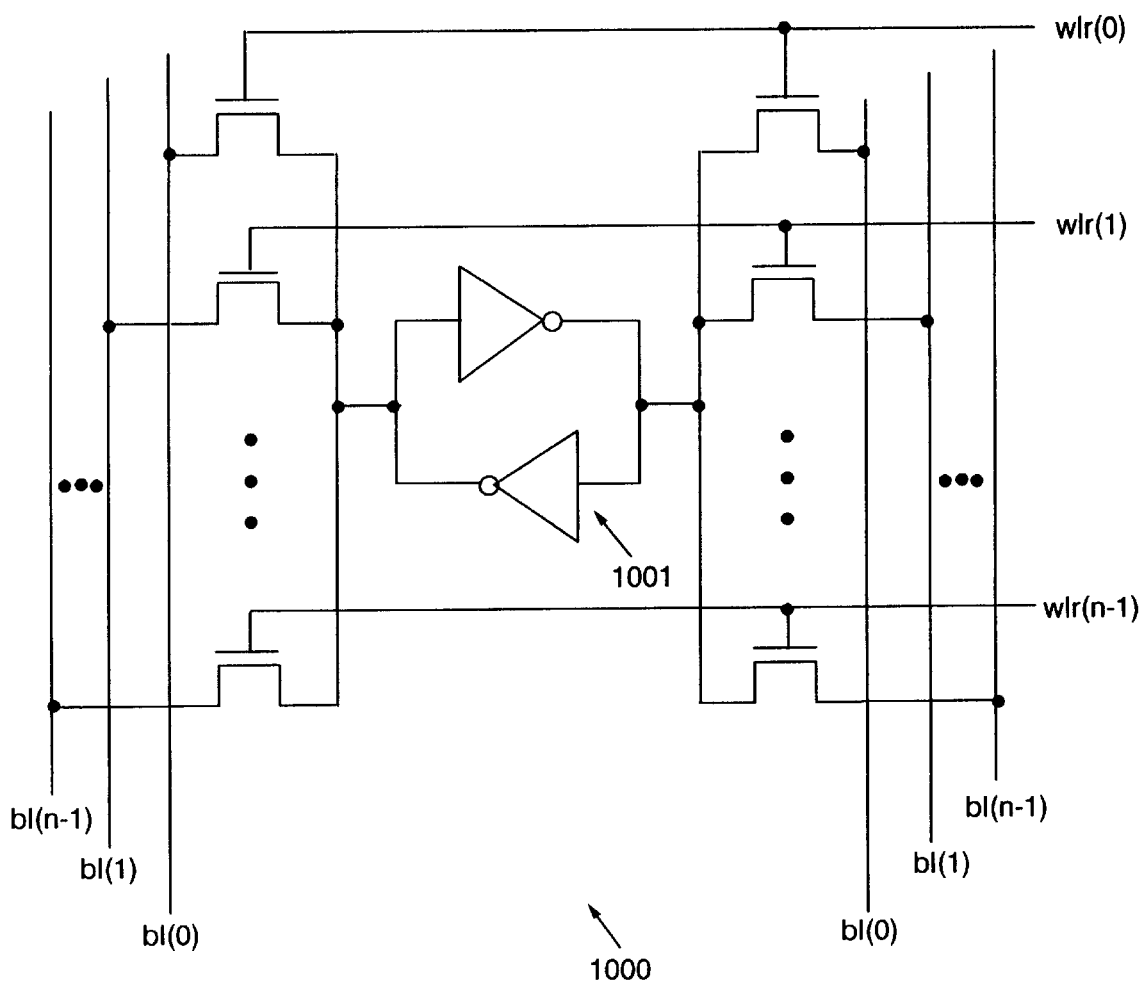
FIGS. 10 and 11 illustrate prior art multiport memory cells.

For fast access time and when multiple units are requesting data at the same time, multiple access ports are often required to a memory cell. With multiple access ports, multiple accesses can be executed without stalling for restoring the bit lines. In a traditional dual-rail multiport SRAM cell 1000 illustrated in FIG. 10, there are two bit lines (b1) and two pass gates for each "port", and each "port" requires two access transistors. True and complement data are written into the cell 1000 through the two pass gates. This is necessary because an NFET pass gate is a good conductor for a logic "0" but a poor conductor for a logic "1."

Figure 11:
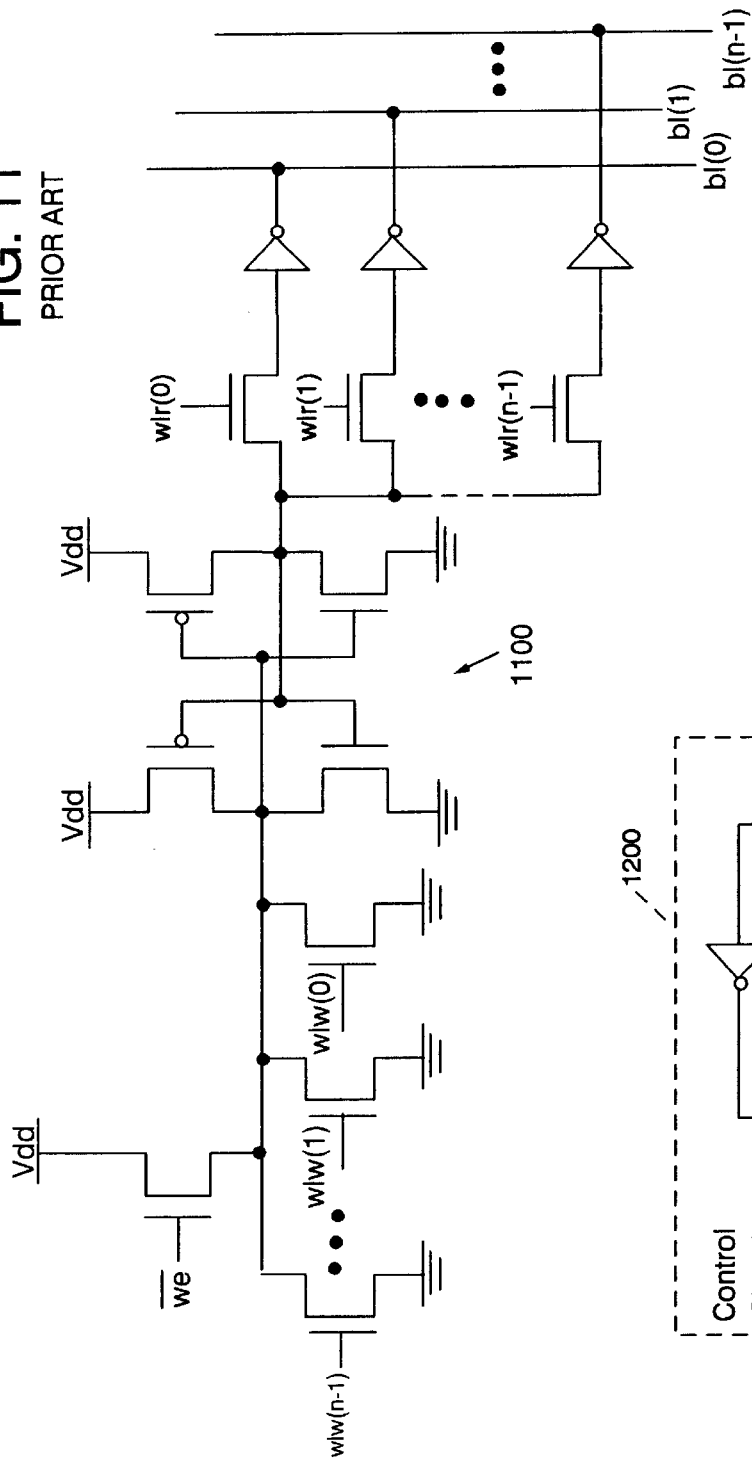

Referring next to FIG. 11, there is illustrated prior art multiport SRAM cell 1100, which can also be coupled to a plurality of units within a processor for multiple accesses to the cell 1100. Upon receiving a write enable signal ($\overline{WE}$), any one of the units can write to cell 1100 with one of signals wlw(0), wlw(1) . . . wlw(n-1). Likewise, multiple reads from cell 1100 can be performed with one or more of signals wlr(0), wlr(1) . . . wlr(n-1) and bit lines b1(0), b1(1) . . . b1(n-1).

The problem with memory cells 1000 and 1100 is that they consume too much silicon and require two many routing lines to implement.

Figure 13:
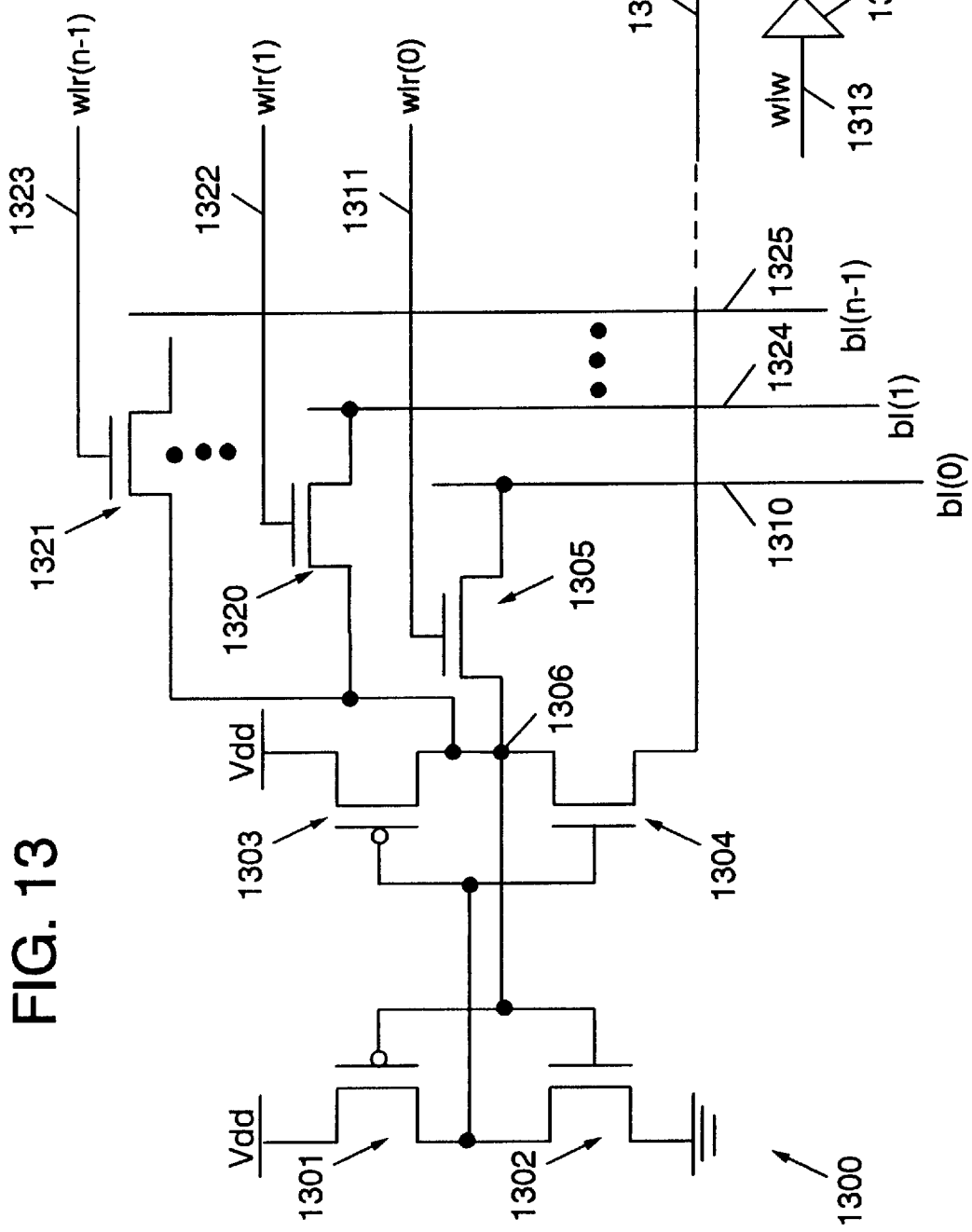
FIG. 13 illustrates a multiport memory cell configured in accordance with the present invention.

Referring next to FIG. 13, there is illustrated memory cell 1300, which is a single ended multiport SRAM memory cell configured in accordance with the present invention, similar to memory cell 100. Devices 1301–1305 operate similar to devices 101–105. Likewise, devices 1308 and 1309 operate in a similar manner to devices 108 and 109. In cell 1300, there is only one pass gate 1305, 1320, 1321 for each respective write line read (wlr) 1311, 1322, 1323 (port). As with memory cell 100, transferring a logic "1" into the memory cell can be a problem, since the signal may flow through device 1304 from node 1306. To solve this problem, as with memory cell 100, node 1312 is allowed to drift between a ground potential and a high impedance state by the use of devices 1308 and 1309 coupled to wlw 1313. The operation of multiport cell 1300 is similar to cell 100 in this regard.

Figure 5:
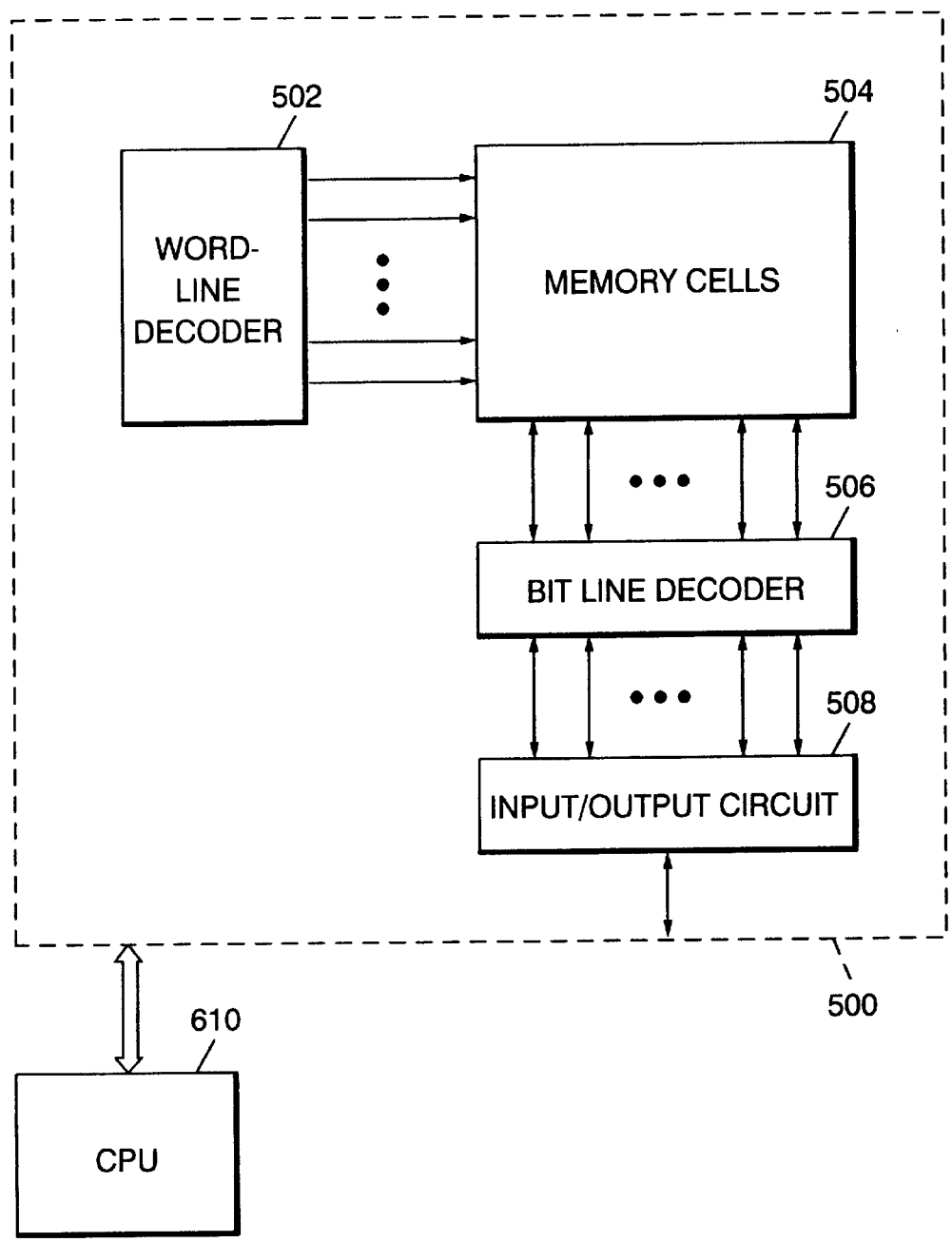
FIG. 5 illustrates a memory subsystem configured in accordance with the present invention.

Referring next to FIG. 5, there is illustrated memory cells 504, which may be implemented with memory cell 100 in accordance with the present invention. Memory cells 504 are accessed using word line decoder 502 and bit line decoder 506 along with input/output circuit 508. Memory subsystem 500 embodying the foregoing may be a cache memory, primary or secondary, coupled to a central processing unit ("CPU") 610. One skilled in the art will be able to configure word line decoder 502 to implement word line read 111 and word line write 113, as described above with respect to FIGS. 1 and 3.

Figure 6:
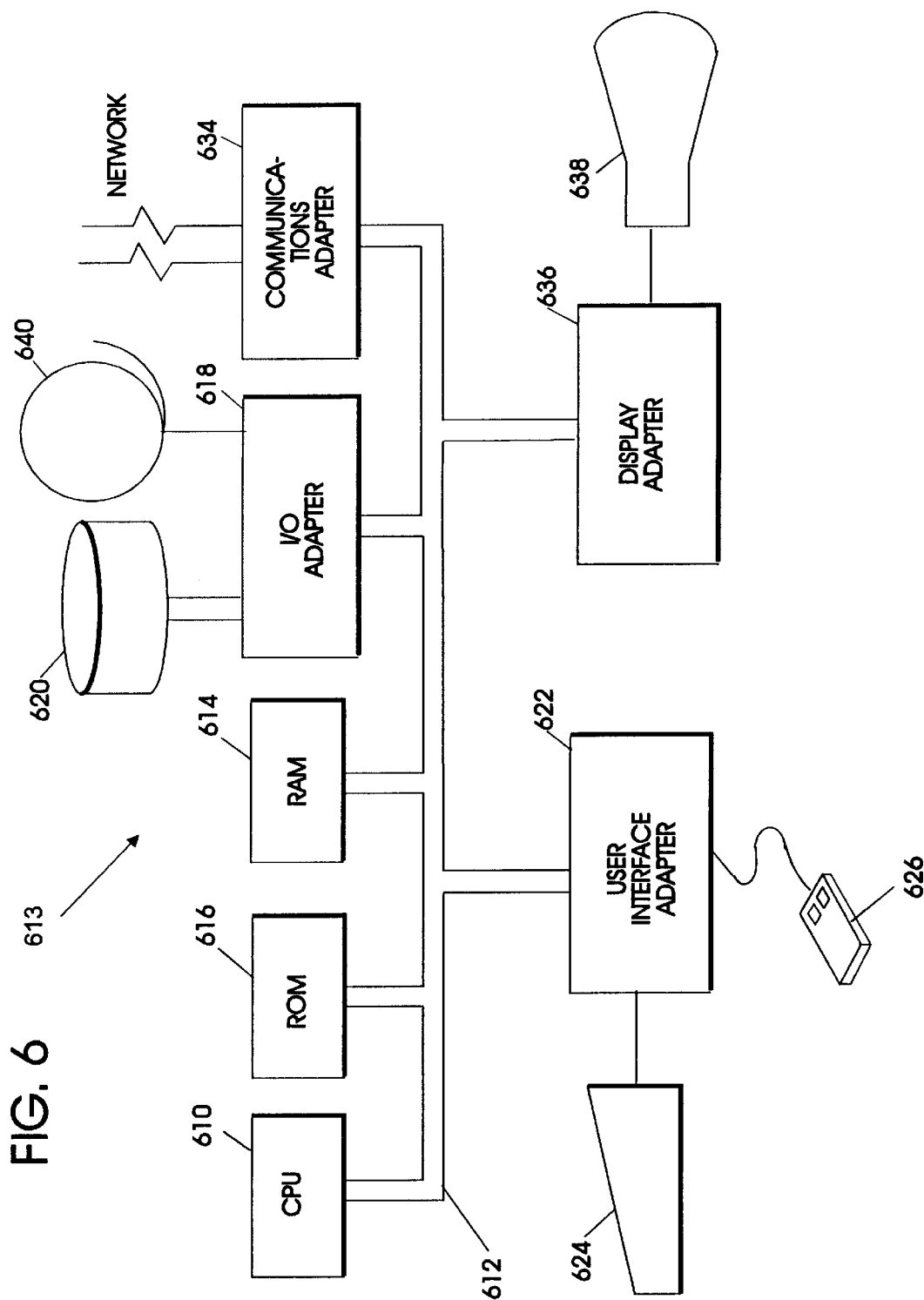
FIG. 6 illustrates a data processing system configured in accordance with the present invention.

CPU 610 may be a portion of data processing system 613 illustrated in FIG. 6.

A representative hardware environment for practicing the present invention is depicted in FIG. 6, which illustrates a typical hardware configuration of data processing system 613 in accordance with the subject invention having central processing unit (CPU) 610, such as a conventional microprocessor, and a number of other units interconnected via system bus 612. System 613 includes random access memory (RAM) 614, read only memory (ROM) 616, and input/output (I/O) adapter 618 for connecting peripheral devices such as disk units 620 and tape drives 640 to bus 612, user interface adapter 622 for connecting keyboard 624, mouse 626, and/or other user interface devices such as a touch screen device (not shown) to bus 612, communication adapter 634 for connecting system 613 to a data processing network, and display adapter 636 for connecting bus 612 to display device 638. CPU 610 may include other circuitry not shown herein, which will include circuitry commonly found within a microprocessor, e.g., execution unit, bus interface unit, arithmetic logic unit, etc. CPU 610 may also reside on a single integrated circuit.

Figure 12:
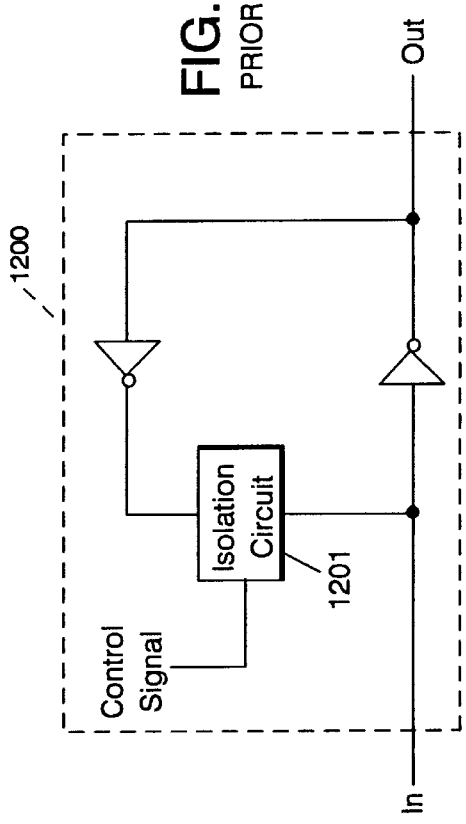
FIG. 12 illustrates a prior art cell.

Referring next to FIG. 12, please note that the prior art does include a memory cell 1200 where isolation circuit 1201, in response to a control signal, is utilized to isolate one of the inverters in cell 1200 from the other during a write operation.

Although the present invention and its advantages have been described in detail, it should be understood that various changes, substitutions and alterations can be made herein without departing from the spirit and scope of the invention as defined by the appended claims.

What is claimed is:

1. A memory cell comprising a storage element, wherein one of the devices included within said storage element is coupled to a controlled impedance node, wherein said controlled impedance node is coupled to said one of said devices when a write operation is being performed on said memory cell, wherein said one of said device's source is allowed to float from a ground potential to a high impedance state during said write operation, wherein said controlled impedance node is implemented with an NFET coupled between ground and said one of the devices, and wherein said memory cell shares said NFET with other memory cells in a storage array.

2. The memory cell as recited in claim 1, wherein said one of said devices is in a high impedance state during said write operation.

3. The memory cell as recited in claim 2, wherein said write operation is performed using only one bit line.

4. The memory cell as recited in claim 3, wherein said memory cell requires only a maximum of three transistors to implement.

5. The memory cell as recited in claim 3, wherein said one of said devices is a first FET coupled to a pass gate coupled to said only one bit line.

6. The memory cell as recited in claim 5, wherein said storage element comprises:
   a first PFET coupled between a potential and a first node, a gate electrode of said first PFET coupled to a second node;
   a first NFET coupled between ground and said first node, a gate electrode of said first NFET coupled to said second node; and
   a second PFET coupled between said potential and said second node, a gate electrode of said second PFET coupled to said first node, wherein said first FET is an NFET coupled between said second node and said controlled impedance node.

7. The memory cell as recited in claim 6, wherein said controlled impedance node is implemented with an NFET coupled between ground and said first FET.

8. The memory cell as recited in claim 1, wherein said storage element further comprises:
   a first PFET coupled between a first potential and a first node, a gate electrode of said first PFET coupled to a second node;
   a first NFET coupled between a second potential and said first node, a gate electrode of said first NFET coupled to said second node;

a second PFET coupled between said first potential and said second node, a gate electrode of said second PFET coupled to said first node;

a second NFET coupled between said controlled impedance node and said second node; and a plurality of pass gates coupled between a corresponding plurality of bit lines and said second node, wherein said second NFET is placed in a high impedance state during a write operation to said memory cell.

9. The memory cell as recited in claim 8, wherein said memory cell is a multiport memory cell.

10. A memory cell comprising at least one control device, wherein said at least one control device is switched to a high impedance state for writing to said memory cell, further comprising:

a first PFET coupled between a first potential and a first node, a gate electrode of said first PFET coupled to a second node;

a first NFET coupled between a second potential and said first node, a gate electrode of said first NFET coupled to said second node;

a second PFET coupled between said first potential and said second node, a gate electrode of said second PFET coupled to said first node;

wherein said at least one control device comprises a second NFET coupled to said second node; and a plurality of pass gates coupled between a corresponding plurality of bit lines and said second node, wherein said second NFET is placed in said high impedance state during a write operation to said memory cell, wherein said memory cell is a multiport memory cell, and wherein each of said plurality of pass gates is coupled to an execution unit in a processor.

11. The memory cell as recited in claim 10, further comprising:

a first PFET coupled between a first potential and a first node, a gate electrode of said first PFET coupled to a second node;

a first NFET coupled between a second potential and said first node, a gate electrode of said first NFET coupled to said second node; and a second PFET coupled between said first potential and said second node, a gate electrode of said second PFET coupled to said first node, wherein said at least one control device comprises a second NFET coupled to said second node, and wherein said memory cell further comprises a pass gate coupled between a bit line and said second node, and wherein said second NFET is placed in said high impedance state during a write operation to said memory cell.

12. The memory cell as recited in claim 11, wherein said bit line is an only bit line coupled to said memory cell.

13. The memory cell as recited in claim 11, further comprising a third NFET coupled between said second potential and said second NFET.

14. The memory cell as recited in claim 13, wherein said third NFET is turned off during said write operation.

15. The memory cell as recited in claim 13, wherein during a read operation said bit line is asserted, said third NFET is turned on, and said pass gate is enabled.

16. The memory cell as recited in claim 14, wherein when a logic "1" is to be written to said memory cell, the following steps are followed:

said third NFET is turned off;

said pass gate is enabled;

said bit line is asserted; and then said third NFET is turned on.

17. The memory cell as recited in claim 14, wherein when a logic "0" is to be written to said memory cell, the following steps are followed:

said third NFET is turned off;

said pass gate is enabled;

said bit line is negated; and then said third NFET is turned on.

18. The memory cell as recited in claim 10, further comprising:

a first control device coupled to a first node, a control terminal of said first control device coupled to a second node;

a second control device coupled to said first node, a control terminal of said second control device coupled to said second node; and a third control device coupled to said second node, a control terminal of said third control device coupled to said first node, wherein said at least one control device comprises a fourth control device coupled to said second node, and wherein said memory cell further comprises a pass gate coupled between a bit line and said second node, and wherein said fourth control device is placed in said high impedance state during a write operation to said memory cell.

19. An apparatus comprising:

a memory device comprising a plurality of storage elements, wherein each of said plurality of storage elements comprises at least one control device, wherein said at least one control device is switched to a high impedance state for writing to said each of said plurality of storage elements, wherein said each of said plurality of storage elements comprises:

a first PFET coupled between a first potential and a first node, a gate electrode of said first PFET coupled to a second node;

a first NFET coupled between a second potential and said first node, a gate electrode of said first NFET coupled to said second node;

a second PFET coupled between said first potential and said second node, a gate electrode of said second PFET coupled to said first node;

a second NFET coupled to said second node;

a pass gate coupled between a bit line and said second node, wherein said second NFET is placed in said high impedance state during a write operation to said memory cell; and a third NFET coupled between said second potential and said second NFET wherein said third NFET is turned off during said write operation, wherein said third NFET is shared among said plurality of storage elements.

20. The apparatus as recited in claim 19, wherein each of said plurality of storage elements is accessible by only one bit line.

21. An apparatus comprising:

a memory device comprising a plurality of storage elements, wherein each of said plurality of storage elements comprises at least one control device, wherein said at least one control device is switched to a high impedance state for writing to said each of said plurality of storage elements, wherein each of said plurality of storage elements comprises:

a first PFET coupled between a first potential and a first node, a gate electrode of said first PFET coupled to a second node;

a first NFET coupled between a second potential and said first node, a gate electrode of said first NFET coupled to said second node;

a second PFET coupled between said first potential and said second node, a gate electrode of said second PFET coupled to said first node;

a second NFET coupled to said second node;

a pass gate coupled between a bit line and said second node, wherein said second NFET is placed in said high impedance state during a write operation to said memory cell, wherein each of said plurality of storage elements is accessible by only one bit line;

a bit line decoder coupled to each of said one bit line;

a word line decoder coupled to each of said plurality of storage elements; and a processor coupled to said memory device.

22. The apparatus as recited in claim 21, wherein said memory device is an SRAM.

23. The apparatus as recited in claim 22, wherein said memory device is a cache memory.

24. The apparatus as recited in claim 22, wherein said memory device is an array.

25. The apparatus as recited in claim 21, further comprising:

a storage device;

a display device;

an input device;

an external memory device; and a bus coupling said storage device, said display device, said input device, and said external memory device to said processor.

26. The apparatus as recited in claim 19, further comprising a control device coupled to said plurality of storage elements for switching each of said at least one control device to said high impedance state.

27. The apparatus as recited in claim 26, further comprising:

a number of lines coupled to each of said plurality of storage elements for writing to said each of said plurality of storage elements.

28. A memory cell comprising a storage element, wherein one of the devices included within said storage element is coupled to a controlled impedance node, wherein said controlled impedance node is implemented with an NFET coupled between ground and said one of the devices, and wherein said memory cell shares said NFET with other memory cells in a storage array.

29. A memory cell comprising a storage element, wherein one of the devices included within said storage element is coupled to a controlled impedance node, wherein said controlled impedance node is coupled to said one of said devices when a write operation is being performed on said memory cell, wherein said controlled impedance node is implemented with an NFET coupled between ground and said one of the devices, and wherein said memory cell shares said NFET with other memory cells in a storage array.

30. A memory cell comprising a storage element, wherein one of the devices included within said storage element is coupled to a controlled impedance node, wherein said controlled impedance node is implemented with a control device coupled between ground and said one of the devices, and wherein said memory cell shares said control device with other memory cells in a storage array.

31. An apparatus comprising:

a memory device comprising a plurality of storage elements, wherein each of said plurality of storage elements comprises at least one control device, wherein said at least one control device is switched to a high impedance state for writing to said each of said plurality of storage elements, wherein said at least one control device is shared among said plurality of storage elements.

32. An apparatus comprising:

a memory device comprising a plurality of storage elements, wherein each of said plurality of storage elements comprises at least one control device, wherein said at least one control device is switched to a high impedance state for writing to said each of said plurality of storage elements, wherein each of said plurality of storage elements comprises another control device coupled between a voltage potential and said each of said plurality of storage elements, wherein said another control device is turned off during said write operation, wherein said another control device is shared among said plurality of storage elements.

* * * * *